United States Patent [19]

Shaffer et al.

[11] 4,227,240
[45] Oct. 7, 1980

[54] PHOTOFLASH UNIT WITH FORMED INSULATING SHEET

[75] Inventors: John W. Shaffer; Donald E. Armstrong, both of Williamsport, Pa.

[73] Assignee: GTE Products Corporation, Stamford, Conn.

[21] Appl. No.: 972,197

[22] Filed: Dec. 22, 1978

[51] Int. Cl.² ............................................. G03B 15/02
[52] U.S. Cl. ...................................... 362/13; 362/10; 362/240; 362/241
[58] Field of Search .................... 362/10, 13, 240, 241

[56] References Cited

U.S. PATENT DOCUMENTS 4,152,751  5/1979  Sindlinger et al. .................... 362/13

Primary Examiner—Stephen J. Lechert, Jr.
Attorney, Agent, or Firm—Edward J. Coleman

[57] ABSTRACT

A photoflash unit comprising a plurality of high voltage type flashlamps mounted on a printed circuit board containing circuitry for sequentially igniting the flashlamps. A plurality of electrically conductive reflectors respectively associated with the flashlamps are disposed between the lamps and the circuit board, with each reflector having an aperture in alignment with a corresponding aperture in the circuit board. Connected in series with each but the last lamp of the array is a radiant-energy-activated disconnect switch comprising a strip of electrically conductive heat-shrinkable polymeric material which is attached at both ends to the circuit board so that the midportion of the strip bridges a respective one of the apertures therein. A sheet of electrically insulating material is interposed between the reflectors and circuit board to prevent shorting therebetween. A plurality of deformations, such as dimples, are formed in the insulating sheet for spacing the sheet from the disconnect switch strips.

13 Claims, 8 Drawing Figures

PHOTOFLASH UNIT WITH FORMED INSULATING SHEET

CROSS-REFERENCE TO RELATED APPLICATIONS

Ser. No. 840,497, filed Oct. 7, 1977, Emery G. Audesse et al, "Multilamp Photoflash Unit", assigned the same as this invention.

Ser. No. 840,498, filed Oct. 7, 1977, Donald E. Armstrong, "Multilamp Photoflash Unit", assigned the same as this invention.

Ser. No. 860,759, filed Dec. 15, 1977, Boyd G. Brower, "Multilamp Photoflash Unit With More Reliable Circuit Arrangement", assigned the same as this invention.

BACKGROUND OF THE INVENTION

The present invention relates to multilamp photoflash units and, more particularly, to improved means for providing electrical insulation between adjacent elements in compact multilamp photoflash units.

Numerous multilamp arrangements with various types of sequencing circuits have been described in the prior art, particularly in the past few years. A currently marketed photoflash unit (described in U.S. Pat. Nos. 3,894,226, 3,912,442, 3,935,442, 3,937,946, 3,941,992, 3,952,320 and 4,017,728 and referred to as a flip flash) employs high-voltage type lamps adapted to be ignited sequentially by successively applied high voltage pulses from a source such as a camera-shutter actuated piezoelectric element. The flip flash unit comprises an elongated planar array of eight high-voltage type flashlamps, each having a pair of lead-in wires connected to a printed circuit board by means of eyelets secured thereon. The circuit board is provided with switching circuitry for causing sequential flashing of the lamps, and an array of respectively associated reflectors are positioned between the lamps and the circuit board. The reflectors for the lamps can be made as a single reflector member shaped to provide multiple individual reflectors for the lamps. The reflector member preferably is electrically conductive, such as being made of metal or metalcoated plastic, and is electrically connected to an electrical "ground" portion of the circuitry on the circuit board. Thus, the reflector member functions as an electrical shield reducing the possibility of accidental flashing of lamps by an electrostatic voltage charge on a person or object touching the unit. Such accidental flashing is particularly prone to occur in this instance as the lamps are high voltage types requiring a firing voltage of 500 to 4,000 volts, for example, at low current.

Although an electrically conductive reflector is desirable, as has just been explained, care must be taken to prevent the reflector unit from shorting the circuitry on the circuit board, which is located immediately behind the reflector unit, thus preventing the circuit from flashing the lamps. According to the above-referenced U.S. Pat. No. 3,894,226 Hanson, this problem is solved by interposing between the reflector unit and circuit board a sheet of electrically insulating material to prevent shorting of the circuitry on the circuit board by the conductive reflector. The insulating sheet may be of a transparent plastic a few thousandths of an inch thick, which transmits sufficient radiation from flashing lamps to actuate adjacent radiation switches in the switching circuitry, and also to actuate flash indicators located behind the circuit board.

With respect to the switching circuitry, it has been found advantageous to use radiant-energy-activated disconnect switches in series with the lamps. Such switches permit more rapid sequencing of the lamps within the array by electrically removing them from the circuit after flashing. The use of disconnect switches also permits the lamp design to be optimized (e.g., with respect to manufacturing cost) without regard for whether or not the lamp may internally short circuit.

A number of radiant-energy-activated disconnect switches have been described in the prior art. Examples are U.S. Pat. Nos. 3,532,931 Cote et al, 3,726,631 De Graaf et al, 3,728,067 De Graaf et al, 3,692,995 Wagner, 3,666,394 Bok. A particularly fast acting disconnect switch is described in the aforementioned U.S. Pat. No. 4,017,728 of Audesse et al, wherein the switch element comprises a piece of electrically conductive, heat shrinkable, polymeric material which is positioned so as to be in operative relationship with the radiant output from the series-connected lamp during the ignition thereof. It has been found, however, that physical contact between the midportion of the disconnect switch and other objects, such as either the circuit board on one side or the transparent insulating sheet on the other side, promotes conductive heat loss and nonpositive switch functioning. Accordingly, each switch element is attached at both ends to the lamp-igniting circuit with the midportion of the element being spatially suspended to avoid contact with heat-absorbing surfaces. In a specific embodiment, the circuit board is provided with a plurality of apertures respectively in alignment, via corresponding reflector apertures, with the flashlamps mounted thereon, and each length of conductive heat shrinkable material comprising a switch is attached to the circuit board so as to bridge a respective aperture therein. In this manner, the midportion of the material is spatially suspended to avoid contact with the circuit board. In addition, the transparent insulating sheet has a plurality of holes located in alignment with respective reflector apertures over the midportions of the disconnect strips, thereby avoiding contact with the insulating sheet. Upon ignition of its associated lamp, the midportion of the switch element rapidly shrinks and separates in response to the radiant output of the lamp, thereby providing a quick-acting, reliable open circuit to high voltages.

It has been found, however, that high voltage sparking sometimes occurs from the conductive disconnect switch to the conductive reflector through the respective hole in the insulating sheet. Since the disconnect switches comprise part of the "hot" circuit and the reflectors are connected to the "common" circuit, such spark-over constitutes an electrical short circuit and promotes lamp failure. It also sometimes happens that a disconnect switch curls during functioning so as to give rise to a web of the conductive switch materials that extends up through the hole in the insulating sheet. The presence of such switch residue projections gives considerably reduced gap lengths and higher likelihood of reliability-decreasing spark-over.

SUMMARY OF THE INVENTION

Accordingly, it is an object of the present invention to provide an improved multilamp photoflash unit which efficiently utilizes a given housing volume yet provides a feasible and economical way of preventing short circuiting of the lamp-sequencing circuit by an adjacent conductive reflector.

A principal object of the invention is to provide an improved insulating sheet for high voltage type photoflash arrays wherein radiant-energy-activated disconnect switches are used in series with one or more lamps.

These and other objects, advantages, and features are attained in a photoflash unit comprising a circuit board having lamp firing circuitry, including one or more disconnect switch strips on the surface thereof, a plurality of flashlamps positioned over that surface and having lead-in wires connected to the circuitry, electrically conductive reflectors with one or more apertures therein positioned between the lamps and the circuit board, and a sheet of electrically insulating material interposed between the reflectors and the circuit board. In accordance with the invention, we have found that the above-described harmful spark-over can be eliminated while retaining excellent disconnect switch functionality by providing an insulating sheet having one or more deformations therein for respectively spacing the sheet from the midportions of the disconnect switch strips to avoid contact therewith. These deformations replace the one or more holes that were heretofore provided in the insulating sheet in respective alignment with the one or more reflector apertures.

In a preferred embodiment, the deformations comprise respective dimples formed in a sheet of transparent polymeric film with the concave surface of each dimple facing a respective one of the strip midportions and the convex surface of each dimple facing a respective one of the reflector apertures. In another embodiment, each deformation comprises a pair of dimples in the polymeric film with protrusions facing the circuit board and spaced apart in alignment with a respective disconnect switch strip to support the film between the dimples in a spaced manner from the midportion of the strip. In yet another embodiment, undulations are provided in the polymeric film.

In this manner, contact heat loss from the disconnect switch to the insulating sheet is avoided. At the same time, complete elimination of the denoted holes in the insulating sheet prevents sparking from the disconnect switch to the reflector.

BRIEF DESCRIPTION OF THE DRAWINGS

This invention will be more fully described hereinafter in conjunction with the accompanying drawings, in which.

DESCRIPTION OF PREFERRED EMBODIMENT

Figure 1:
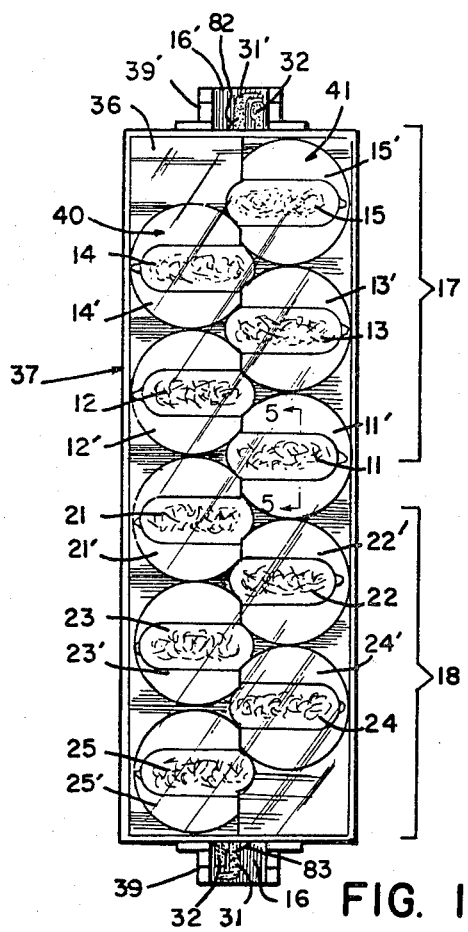
FIG. 1 is a front elevation of a multilamp photoflash unit in which the present invention is employed.

FIG. 1 illustrates a multilamp photoflash unit of the type described in the aforementioned copending application Ser. No. 840,497, Audesse et al. This unit is similar in general operation to that described in the aforementioned U.S. Pat. No. 4,017,728, except that the construction has been modified to include additional lamps in a housing having the same outer dimensions. Whereas the unit described in the above-mentioned patent included a planar array of eight high voltage type flashlamps (two groups of four) with associated reflector cavities provided in a single reflector member, the present unit comprises a planar array of ten photoflash lamps 11—15 and 21—25 mounted on a printed circuit board 43 (see FIGS. 2 and 4) with an array of respectively associated reflector cavities 11'—15' and 21'—25' disposed therebetween. The lamps are horizontally disposed and mounted in two parallel columns, with the lamps of one column staggered relative to the lamps of the other column. Each of the lamps has a pair of lead-in wires 11a, 11b, etc., connected to the printed circuitry on board 43 by respective eyelets 11a' and 11b', etc. The column of the lamps 15, 13, 11, 22, and 24 are positioned with their respective bases interdigited with the bases of the adjacent column comprising lamps 14, 12, 21, 23, and 25, the bases of one column thereby facing the adjacent column. The reflector cavities are provided on a pair of strip-like panels 40 and 41 which are conveniently separable for assembly purposes, as particularly illustrated in FIG. 4. The array is provided with a plug-in connector tab 16 at the lower end thereof which is adapted to fit into a camera or flash adapter. A second plug-in connector tab 16' is provided at the top end of the unit whereby the array is adapted to be attached to the camera socket in either of two orientations, i.e., with either the tab 16 or the tab 16' plugged into the socket. The lamps are arranged in two groups of five disposed on the upper and lower halves, respectively, of the elongated, rectangular-shaped array. Upper group 17 comprises lamps 11—15, and lower group 18 includes lamps 21—25; the reflector cavities 11' etc. are disposed behind the respective lamps so that as each lamp is flashed, light is projected forwardly of the array. The lamps are arranged and connected so that when the array is connected to a camera by the connector tab 16, only the upper group 17 of lamps will be flashed, and when the array is turned end for end and connected to the camera by the other connector tab 16', only the then upper group of lamps will be flashed. By this arrangement, only lamps relatively far from the camera lens axis are flashable, thus reducing the undesirable red-eye effect.

The construction of the array comprises front and back housing members 36 and 37 (see FIGS. 1 and 5) which preferably are made from plastic and are provided with interlocking members (not shown) which can be molded integrally with the housing members together in final assembly to form a unitary flash array structure. In the preferred embodiment, the front housing member 36 is a rectangular concavity and the back housing member 37 is substantially flat and includes integral extensions 39 and 39' at the ends thereof which partly surround and protect the connector tabs 16 and 16' and also function to facilitate mechanical attachment of the camera socket. Sandwiched between the front and back housing members 36 and 37, in the order named, are the flashlamps 11, etc., the pair of adjacent strip-like reflector panels 40 and 41 (preferably each being an aluminum-coated molding) shaped to provide the individual reflector cavities 11', etc., a transparent electrically insulating sheet 42 (see, for example, FIGS. 3—5), the printed circuit board 43 provided with integral connector tabs 16 and 16', and indicia sheet 44 (denoted only in FIG. 5) which may be provided with information and trademarks, and other indicia such as flash indicators located behind the respective lamps and which change color due to heat and/or light radiation from a flashing lamp, thus indicating at a glance which of the lamps have been flashed and not flashed.

Figure 4:
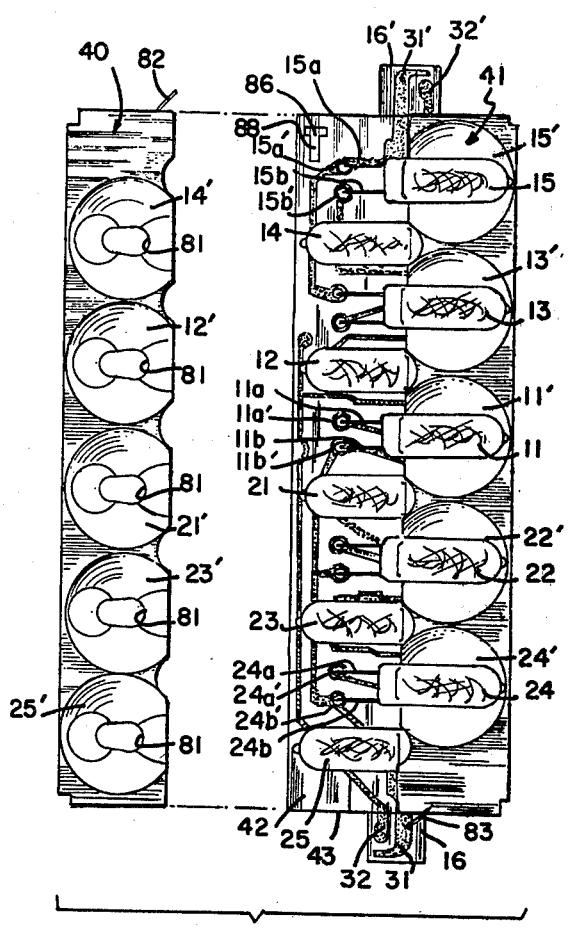
FIG. 4 is a front elevation of the unit of FIG. 1 with the cover removed and one of the reflector panels separated and spaced to the side.

Referring to FIG. 4, window means, such as openings 81, are provided in each of the reflector cavities 11', etc., behind the lamp aligned therewith. The circuit board 43 is provided with corresponding openings 30 to facilitate radiation from the flashlamps reaching the flash indicators. The rear member 37 is transparent (either of clear material or provided with window openings) to permit viewing of the indicia on the indicia sheet. The front housing member 36 is transparent, at least in front of the lamps 11, etc., to permit light from the flashing lamps to emerge forwardly of the array and may be tinted to alter the color of the light from the flashlamps. The height and width of the rectangular array are substantially greater than its thickness, and the height and width of the reflector panels 40, 41, the insulating sheet 42, and the circuit board 43 are substantially the same as the interior height and width of the housing member 36 to facilitate holding the parts in-place.

The tab 16, which is integral to the circuit board 43, is provided with a pair of electrical terminals 31 and 32, and similarly the tab 16' is provided with a pair of terminals 31' and 32', for contacting terminals of a camera socket for applying voltage pulses to the array. The terminals 31 and 31' are shown as having a J-shaped configuration for temporarily shorting the socket terminals, while the array is being plugged in, to discharge any residual voltage charge in the firing pulse source and also to reduce the likelihood of lamps being accidentally flashed by electrostatic voltage when the array is handled.

Figure 2:
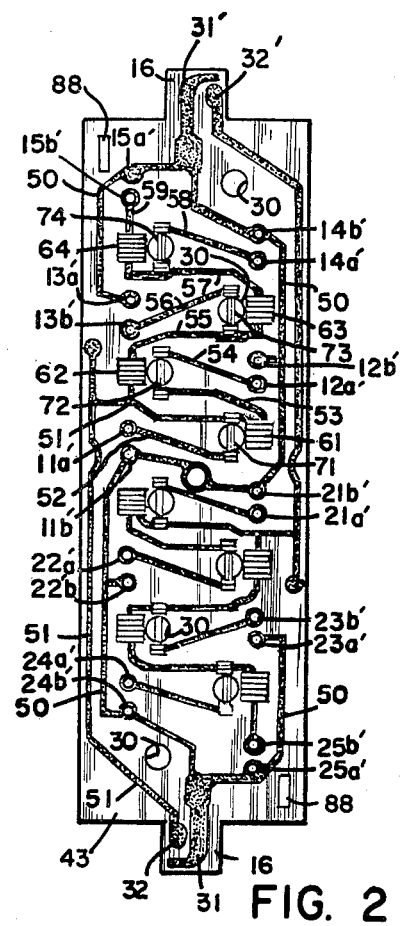
FIG. 2 is a front elevation of a printed circuit board used in the unit of FIG. 1.

Referring to FIG. 2, the circuit board 43 has a "printed circuit" thereon for causing sequential flashing of the lamps by firing voltage pulses applied to the terminals 31, 32, 31', 32'. The printed circuit may be functionally similar to that described in the aforementioned U.S. Pat. Nos. 3,894,226 or 4,017,728 except for extending the circuitry to accommodate an additional lamp in each half of the printed circuit board. A preferred embodiment of the circuitry, however, is that described in the previously referenced copending application Ser. No. 860,759. The top and bottom halves of the printed circuitry preferably are reverse mirror images of each other. The lead wires 11a, 11b, etc., underlie the reflector panels and pass into or through suitable openings 11a", 11b", etc., in the insulating sheet 42 (FIG. 3) and into or through the respective pairs of eyelets 11a', 11b', etc. in the circuit board. The shanks of the eyelets which project from the other side of the board are then crimped or bent to hold the lead wires and make electrical contact thereto and also to hold the eyelets in place with their heads in electrical contact with the circuit of the circuit board. As previously mentioned, the reflector panels 40 and 41 are preferably made of metal-coated plastic so that they are electrically conductive. Each reflector panel is electrically connected to a "ground" or common connection circuit by means such as wires 82 and 83. More specifically, referring to FIGS. 1 and 4, wire 82 connects the conductive reflector panel 40 to the terminal 31', and wire 83 connects the conductive reflector panel 41 to terminal 31. Terminals 31 and 31' are part of an electrical "ground" circuit run 50 on the board 43 which makes contact with one of the connector eyelets 11a', 11b', etc., for each of the lamps 11, etc., whereby the reflector panels 40 and 41 additionally function as an electrically grounded shield, as generally described in the aforementioned flip flash patents.

As further described in U.S. Pat. Nos. 3,894,226 and 4,017,728, the circuitry on circuit board 43 includes radiation switches which are in contact with and bridge across circuit runs that are connected to them. A preferred circuit arrangement is that described in the aforementioned copending application Ser. No. 860,759. It will be noted that the circuit located in the upper half of the circuit board of FIG. 2 and activated by the pair of input terminals 31 and 32 include five lamps 11–15 arranged in parallel across the input terminals and four normally closed radiant-energy-activated disconnect switches 71, 72, 73 and 74 each connected in series with a respective one of the lamps 11–14. Each disconnect switch is responsive to the flashing of a lamp with which it is series connected to form an open circuit. The circuit also includes four normally open radiant-energy-activated connect switches 61, 62, 63, and 64 for providing sequential flashing of the lamps 11–15 in response to firing pulses successively applied to the input terminals 31 and 32. The material for the connect switches 61–64 is selected to be of the type initially having an open circuit or high resistance, the resistance thereof becoming nearly zero or a lower value when the material receives radiation in the form of heat and/or light from a respective adjacent lamp, upon the lamp being flashed. For this purpose, each of the connect swiches is respectively positioned behind and near to an associated flashlamp. To facilitate radiation transfer from the flashlamp to its corresponding connect switch, each of the reflectors includes a window means, such as an opening 81 (FIG. 4), in alignment with the respective radiation connect switches. In addition, the sheet of insulating material 42, which is disposed between the reflector panels and the printed circuitry, is of a material which is transparent to the lamp radiation. Each of the connect switches has a composition which may comprise a known mixture of silver compound and a binder. According to a preferred embodiment, the material comprises a silver compound such as silver carbonate, a binder such as polystyrene resin, and a protective oxidizing agent, such as barium chromate, as described in U.S. Pat. No. 4,087,233. For example, the dry composition of a specific silk screenable high resistance material such as has been employed for such a patch pattern (i.e. switches 61–64) comprises 98.75 percent silver carbonate, 0.25 percent barium chromate, and 1.0 percent polystyrene resin as a binder.

Figure 6:
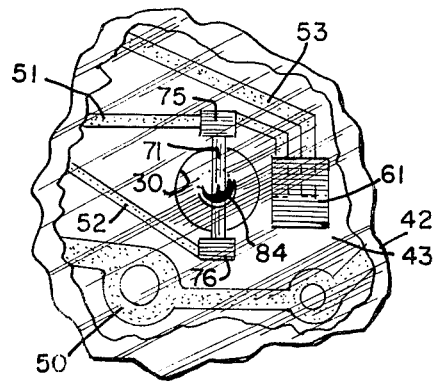
FIG. 6 is an enlarged fragmentary detail view of a portion of the circuit board of FIG. 2 showing the insulating sheet superimposed thereover in accordance with the invention.

As described in the previously referenced U.S. Pat. No. 4,017,728 Audesse et al, each of the disconnect switches 71–74 comprises a length of electrically conductive heat-shrinkable polymeric material which is attached to the circuit board at both ends, with its midportion spatially suspended to avoid contact with the heat absorbing surface of the circuit board. This arrangement maximizes the speed with which the shrinking and separation of the midportion of the switch element occurs upon its being heated by the radiant output of an ignited flashlamp. More specifically, the disconnect switch comprises a thin strip of plastic preferably fabricated from mono- or biaxially oriented polyethylene, polypropylene, polystyrene, polyester or nylon. The polymeric material itself may be rendered electrically conductive by esters such as carbon, or it may be rendered surface conductive by deposition of conductive layers thereon. The performance of highly reflective materials, such as aluminized polypropylene, can be enhanced by applying a coating of light-absorbing ink or other similar material on the surface facing the flashlamp. The piece of switch material may be self-adhesive, such as a tape, and pressure applied to attach both ends of the strip (71-74) to the circuit board as illustrated. Each attached strip is located so that it bridges a respective one of the circuit board apertures 30 so as to provide the desired spatial suspension of the midportion of the strip. For silk screened circuitry, it is advantageous to carry the circuit pattern over the ends of the preapplied switch strip. In this manner, the circuit material helps to anchor the switch ends to the circuit board substrate, in addition to providing electrical connection at both ends of the switch material to the printed circuit. Further, as best shown in FIG. 6, patches 75 and 76 of the same high resistance material used for connect switches 61-64 may cover each end of each conductive strip 71 to provide insulation for preventing shorting or spark-over between the strip ends and the nearby circuit traces 53 or 50.

Figure 5:
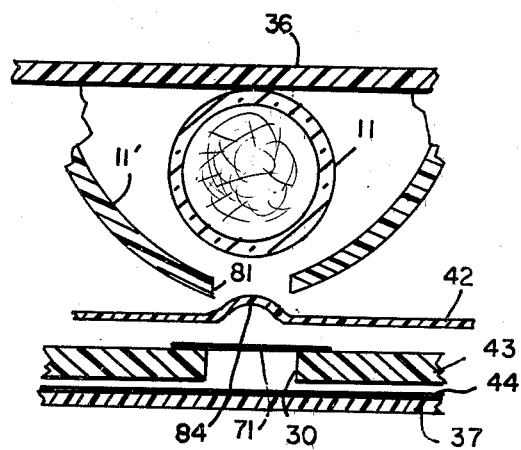
FIG. 5 is an enlarged schematic cross-sectional view taken along 5—5 of FIG. 1.

By locating the disconnect switch strips 71-74 across the apertures 30, each element of heat shrinkable material is positioned so as to be in operative relationship with the radiant output of its respective lamp via an aperture 81 in the back of the reflector (FIG. 5). As previously mentioned, the insulating sheet 42 interposed between the conductive reflectors and the circuit board carrying disconnect switch strips 71-74 is transparent to this radiant output. Hence, upon ignition of a given flashlamp, the switch material is radiantly heated so that it weakens and softens as well as shrinks. As separation occurs near the center of each piece, the two separate ends shrink back away from each other so as to give an open circuit that will reliably withstand several thousand volts without leakage. Since a lamp after flashing is removed electrically from the circuit, the subsequent lamps are unaffected by short circuiting or residual conductivity in previously flashed lamps.

Terminal 32 is part of a conductor run 51 that terminates at three different switches, namely, the disconnect switch 71, the connect switch 61, and the connect switch 62. The other side of switch 71 is connected to lamp 11 via circuit run 52 and eyelet 11a'. Circuit run 53 connects switches 61 and 72, and circuit run 54 connects the other side of switch 72 to lamp 12 eyelet 12a'. A circuit run 55 interconnects switches 62, 73 and 63, while the other side of switch 73 is connected to lamp 13 via circuit run 56 and eyelet 13b'. Switches 63, 74 and 64 are interconnected by a circuit run 57, while the other side of switch 74 is connected to lamp 14 via circuit run 59 and eyelet 14a'. Finally, a circuit run 59 connects the other side of switch 64 to lamp 15 via eyelet 15b'.

The circuit on the circuit board 43 functions as follows. Assuming that none of the five lamps in the upper half of the unit have been flashed, upon occurence of the first firing pulse applied across the terminals 31 and 32, this pulse will be directly applied to the lead-in wires of the first connected flashlamp 11, whereupon the lamp 11 flashes and becomes an open circuit between its lead-in wires. Heat and/or light radiation from the flashing first lamp 11 is operative via its respective reflector aperture to activate the disconnect switch 71 and the connect switch 61. As a result, the normally closed disconnect switch 71 is operative in response to the radiation from the lamp to rapidly provide a reliable open circuit to high voltage and thus electrically remove lamp 11 from the circuit, whereby the subsequent lamps 12-15 are unaffected by short circuiting or residual conductivity in lamp 11. The radiation causes the normally open connect switch 61 to become a closed circuit (or a low value of resistance), thereby connecting the circuit board terminal 32 electrically to the second lamp 12 via the normally closed disconnect switch 72. By the time this occurs, the firing pulse has diminished to a value insufficient to cause the second lamp 12 to flash. When the next firing pulse occurs, it is applied to the lead-in wires of the second lamp 12 via the now closed connect switch 61 and disconnect switch 72, whereupon the second lamp 12 flashes, thereby causing disconnect switch 72 to rapidly provide an open circuit and causing the next switch 62 to assume near zero or low resistance. Once switch 62 has been activated, the resistance of the connect switch 61 is bypassed along with any potential discontinuity caused by the disconnect switch 71. When the next firing pulse occurs, it is applied via now closed connected switch 62 and disconnect switch 73 to the third lamp 13, thereby firing that lamp, whereupon the radiation from lamp 13 activates disconnect switch 73 to rapidly provide an open circuit and causes connect switch 63 to become essentially a closed circuit across its terminals. The next firing pulse will be applied via now closed connect switch 63 and disconnect switch 74 to the lead-in wires of the fourth flashlamp 14, thereupon causing the lamp to flash. The radiation from 14 activates the disconnect switch 74 to rapidly provide an open circuit and causes connect switch 64 to become essentially a closed circuit across its terminals. Thus, the next firing pulse will be applied via now closed connect switch 64 to the lead-in wires of the fifth flashlamp 15, thereupon causing the lamp to flash. Since this lamp is the last lamp in the active circuit, it does not matter whether its lead-in wires are an open or closed circuit after flashing. The flash indicator aligned behind the last lamp 15 may be of a special type, such as that described in copending application Ser. No. 844,872, filed Oct. 25, 1977 and assigned to the present assignee, for particularly alerting the user to remove the flash unit from the camera and either turn it around or obtain a fresh unit. In such an application, it is desirable to provide larger openings 85 (FIG. 3) in the insulator sheet 42 which coincide with the circuit board openings 30 disposed behind the last lamps 15 and 25. Such an opening assures sufficient radiation transfer from the flashed lamp to properly activate the last-flash indicator. When the flash unit is turned around and the other connector tab 16' attached to the camera socket, the group 18 of lamps that then becomes uppermost and farthest away from the lens axis will be in the active circuit and will be flashed in the same manner as has been described. In a preferred embodiment, the lamps 11 etc., are high voltage type requiring about 2,000 volts, for example, at low current for flashing, and they can be fired by impacting or stressing a piezoelectric element in the camera.

Of particular concern with respect to the present invention is the electrically insulative sheet 42 which is provided between the reflector panels 40 and 41 are electrically conductive and connected to electrical ground of the circuit so as to function as a shield, any conductive areas on the back surface of the reflector unit could, but for the sheet 42, touch circuit runs or switches 61–64 and 74–74 on the circuit board and cause a short circuit which would prevent the sequencing circuitry from functioning. Preferably, the sheet 42 is thin, such as a few thousandths of an inch thick, and made of a transparent polymeric film, such as cellulose acetate or polyethylene terephthalate resin (the latter material being available as Mylar polyester film, Mylar being a registered trademark of E.I. du Pont de Nemours and Co.) which transmits a sufficient amount of radiation (heat and/or light) from flashing lamps to actuate the switches 61–64 and 71–74 and flash indicators (not shown). Use of the insulator sheet 42 permits the reflector panels to be very close to the circuit board 43, resulting in a compact array construction, and prevents shorting of the circuit by the reflector unit.

Figure 3:
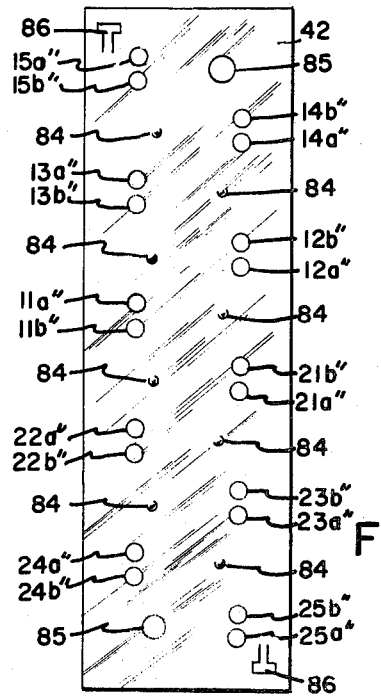
FIG. 3 is a front elevation of a sheet of electrically insulating material formed with dimples in accordance with the invention.

In accordance with the present invention, as distinguished from the insulating sheet for the eight-lamp flip flash unit described in U.S. Pat. No. 3,894,226 and the insulating sheet for the ten-lamp unit described in co-pending application Ser. No. 861,652, filed Dec. 19, 1977, and assigned to the present assignee, the sheet of insulating material 42 employed in the ten-lamp unit of FIG. 1 is provided, as illustrated in FIGS. 3, 5 and 6, with a plurality of small dimples 84 for selectively spacing sheet 42 from the midportions of the disconnect switch strips 71, etc. As shown in FIGS. 5 and 6, each dimple 84 is aligned with a respective circuit board opening 30 and reflector aperture 81 over the midportion of a respective disconnect switch strip 71, etc. The concave surface of each of the dimples formed in the polymeric film 42 faces a respective one of the strip midportions, and the convex surface of the dimple faces the respective reflector aperture, as best shown in FIG. 5. In this manner, the dimples respectively space sheet 42 from the midportions of the heatshrinkable strips 71 etc. to avoid contact therewith. Further, there are no holes through the dimples, thereby eliminating possible areas of sparking.

Such dimples are readily formed in the polymeric insulating film by pressing the film between e.g., a spherical die and mating cavity so as to stretch and permanently deform this localized spot of insulating material that lies over the disconnect switch.

Testing of 1,000 photoflash units of the general type illustrated, using dimples 84 approximately 0.100 inch in diameter and 0.020 inch high in a 0.005" thick transparent Mylar polyester film 42, exhibited excellent disconnect switch reliability and freedom from sparking between the disconnect switches 71, etc., (or residue therefrom) and the reflectors.

In order to locate and secure the insulating sheet 42 with the dimples and holes in proper alignment over the circuit board 43, two spaced-apart tabs 86 are provided in sheet 42, and a pair of corresponding slots 88 are provided in circuit board 43 for receiving the tabs 86, as described in copending application Ser. No. 861,652, filed Dec. 19, 1977 and assigned to the present assignee.

Figure 7:
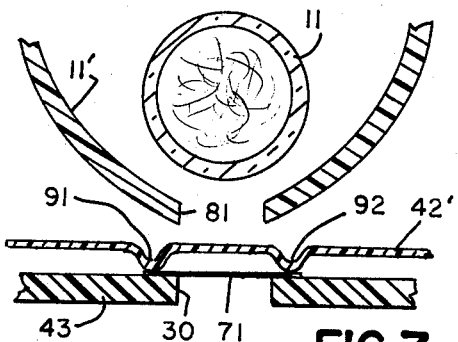
FIG. 7 is an enlarged cross-sectional schematic illustrating an alternative embodiment of the invention.

FIG. 7 illustrates an alternative embodiment of the invention wherein the deformations in an insulating sheet 42' (such as polymeric film) comprises a respective pair of dimples 91 and 92 for each of the disconnect switch strips 71, etc. The convex protrusions of each dimple pair 91, 92 face the circuit board and are spaced apart in alignment with a respective strip 71, etc., to support the sheet, or film, 42' between the dimples 91, 92 in a spaced manner from the midportion of the respective strip 71, etc.

Figure 8:
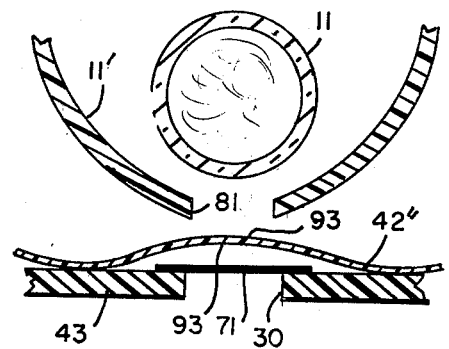
FIG. 8 is an enlarged cross-sectional schematic illustrating another alternative embodiment of the invention.

Another alternative embodiment is illustrated in FIG. 8 wherein the deformations comprise an undulated configuration of an insulating sheet (or polymeric film) 42". The crests 93 of the undulation are aligned with the reflector aperture 81 so that spaced portions of the undulated film are aligned over the midportions of strips 71, etc. The technique of FIG. 7, and particularly that of FIG. 8, however, may increase the front-to-back dimensional requirement of the photoflash unit.

Although the present invention has been described with respect to specific embodiments, it will be appreciated that modifications and changes may be made by those skilled in the art without departing from the true spirit and scope of the invention. For example, the principles of the invention are also applicable on eight-lamp photoflash units of the type shown in U.S. Pat. No. 4,017,728.

What we claim is:

1. A photoflash unit comprising a printed circuit board having circuitry on a surface thereof, a plurality of flashlamps positioned over said surface and having lead-in wires connected to said circuitry, said circuitry being provided for sequentially igniting said flashlamps, a plurality of conductive reflectors respectively associated with said flashlamps and positioned between said lamps and said circuit board, at least one of said reflectors having an aperture therein, a radiant-energy-activated disconnect switch attached to said circuit board in alignment with said aperture in the reflector, said disconnect switch being electrically connected to said circuitry in series with a respective one of said flashlamps for interrupting the ignition circuit for said flashlamp after said flashlamp is ignited, said disconnect switch comprising a conductive strip of heat-separable material attached at both ends to said circuit board with the midportion of said strip being spatially suspended to avoid contact with said circuit board, said strip midportion being positioned so as to be in operative relationship with the radiant output from a respective ignited flashlamp via said aperture in the reflector, a sheet of electrically insulating material interposed between said reflectors and said circuit board, and a deformation provided in said sheet of insulating material for spacing said sheet from the midportion of said strip to avoid contact therewith.

2. The photoflash unit of claim 1 wherein said deformation comprises a dimple in said sheet of insulating material with the concave surface thereof facing the midportion of said strip and the convex surface thereof facing said aperture in the reflector.

3. The photoflash unit of claim 1 wherein said deformation comprises a pair of dimples in said sheet of insulating material with convex protrusions facing the said circuit board and spaced apart in alignment with said strip to support the portion of said sheet between the dimples in a spaced manner from the midportion of said strip.

4. The photoflash unit of claim 1 wherein said deformation comprises an undulated configuraion of said sheet of insulating material with a crest of said undulation aligned with said aperture in the reflector whereby a spaced portion of said undulated sheet is aligned over the midportion of said strip.

5. The photoflash unit of claim 1 wherein said insulating sheet is a transparent polymeric film comprising cellulose acetate or polyethylene terephthalate resin.

6. The photoflash unit of claim 1 wherein at least a subplurality of said reflectors each have an aperture therein, a respective subplurality of radiant-energy-activated disconnect switches are attached to said circuit board in alignment respectively with the apertures of said reflectors, each of said disconnect switches are electrically connected to said circuitry in series with a respective one of said flashlamps for interrupting the ignition circuit for said flashlamp after said flashlamp is ignited, each of said disconnect switches comprise a conductive strip of heat-separable material attached at both ends to said circuit board with the midportion of said strip being spatially suspended to avoid contact with said circuit board, each of said strip midportions is positioned so as to be in operative relationship with the radiant output from a respective ignited flashlamp via the aperture in a respective reflector, and a respective subplurality of deformations are provided in said sheet of insulating material for respectively spacing said sheet from the midportions of said strips to avoid contact therewith.

7. The photoflash unit of claim 6 wherein said circuit board has at least a respective subplurality of apertures in alignment respectively with the apertures of said reflectors, and the midportion of each of said strips of heat-separable material is spatially suspended by briding a respective one of the apertures in said circuit board.

8. The photoflash unit of claim 7 wherein each of said disconnect switches comprises a strip of polymeric material which has been rendered electrically conductive.

9. The photoflash units of claim 8 wherein each of said polymeric strips comprises a heat-shrinkable material.

10. The photoflash unit of claim 7 wherein said insulating sheet is a transparent polymeric film.

11. The photoflash unit of claim 10 wherein said deformations comprise a respective subplurality of dimples formed in said sheet of polymeric film with the concave surface of each dimple facing a respective one of said strip midportions and the convex surface of each dimple facing a respective one of said reflector apertures.

12. The photoflash unit of claim 10 wherein said deformations comprise a respective subplurality of pairs of dimples formed in said sheet of polymeric film with convex protrusions of each pair facing said circuit board and spaced apart in alignment with a respective one of said strips to support the portion of said film between said pair of dimples in a spaced manner from the midportion of said respective strip.

13. The photoflash unit of claim 10 wherein said deformations comprise an undulated configuration of said sheet of polymeric film with crests of said undulation aligned with said reflector apertures whereby spaced portions of said undulated film are aligned over the midportions of said strips.

* * * * *